United States Patent
Vanderzon

(10) Patent No.: US 10,079,551 B2
(45) Date of Patent: Sep. 18, 2018

(54) SYMMETRY CONTROL CIRCUIT OF A TRAILING EDGE PHASE CONTROL DIMMER CIRCUIT

(71) Applicant: Ozuno Holdings Limited, Tortola (VG)

(72) Inventor: James Vanderzon, MacDonald Park (AU)

(73) Assignee: Ozuno Holdings Limited, Tortola (VG)

( * ) Notice: Subject to any disclaimer, the term of this patent is extended or adjusted under 35 U.S.C. 154(b) by 22 days.

(21) Appl. No.: 15/313,068

(22) PCT Filed: May 20, 2015

(86) PCT No.: PCT/AU2015/000298
§ 371 (c)(1),
(2) Date: Nov. 21, 2016

(87) PCT Pub. No.: WO2015/176111
PCT Pub. Date: Nov. 26, 2015

(65) Prior Publication Data
US 2017/0149342 A1  May 25, 2017

(30) Foreign Application Priority Data

May 22, 2014 (AU) ................................ 2014901924

(51) Int. Cl.
*H02M 5/257* (2006.01)
*H02M 1/08* (2006.01)
(Continued)

(52) U.S. Cl.
CPC ......... *H02M 5/2573* (2013.01); *H02M 1/081* (2013.01); *H05B 33/0845* (2013.01); *H02M 2001/0058* (2013.01)

(58) Field of Classification Search
CPC .... H05B 33/02; H05B 33/08; H05B 33/0803; H05B 33/0806; H05B 33/0815;
(Continued)

(56) References Cited

U.S. PATENT DOCUMENTS

| | | | |
|---|---|---|---|
| 5,173,643 A | 12/1992 | Sullivan et al. | |
| 8,040,070 B2 | 10/2011 | Myers et al. | |

(Continued)

FOREIGN PATENT DOCUMENTS

| | | |
|---|---|---|
| WO | WO 2009/140525 | 11/2009 |
| WO | WO 2013/063646 | 5/2013 |
| WO | WO 2015/176111 | 11/2015 |

OTHER PUBLICATIONS

International Search Report and Written Opinion of International Patent Application No. PCT/AU2015/000298, filed May 20, 2015. Received Jul. 1, 2015. 8 pages.

*Primary Examiner* — Jason M Crawford
(74) *Attorney, Agent, or Firm* — The Webb Law Firm

(57) ABSTRACT

A symmetry control circuit for a trailing edge phase control dimmer circuit for controlling alternating current (AC) power to a load, the symmetry control circuit including: a bias signal generator circuit configured to monitor non-conduction periods of each half cycle of said AC power for an elapsed duration of the non-conduction periods, and generate a bias signal voltage based on the elapsed duration, whereby an amplitude of the bias signal voltage is proportional to the elapsed duration of the non-conduction periods; and a bias signal converter circuit configured to convert the bias signal voltage to a bias signal current, wherein the bias signal current is added to a reference current of a conduction period timing circuit configured to determine said conduction periods, and wherein the conduction period timing circuit is configured to alter one of the conduction periods immediately following one of the non-conduction periods (Continued)

based on the bias signal current when added to the reference current to compensate for a phase shift of a zero-crossing of said one of the non-conduction periods corresponding to an elapsed duration of said one of the non-conduction periods so as to restore symmetry of the non-conduction periods of each half cycle of AC power.

13 Claims, 5 Drawing Sheets

(51) Int. Cl.
*H05B 33/08* (2006.01)
*H02M 1/00* (2006.01)

(58) Field of Classification Search
CPC .......... H05B 33/0842; H05B 33/0845; H02M 5/2573; H02M 1/081
See application file for complete search history.

(56) References Cited

U.S. PATENT DOCUMENTS

| | | | |
|---|---|---|---|
| 2014/0028194 A1* | 1/2014 | Kitamura | H05B 33/0809 315/127 |
| 2014/0176016 A1* | 6/2014 | Li | H05B 33/0803 315/307 |
| 2014/0285099 A1* | 9/2014 | Akahoshi | H05B 33/0815 315/200 R |
| 2017/0150566 A1* | 5/2017 | Vanderzon | H05B 33/0845 |
| 2017/0231038 A1* | 8/2017 | Vanderzon | H05B 33/0815 |

* cited by examiner

SYMMETRY CONTROL CIRCUIT OF A TRAILING EDGE PHASE CONTROL DIMMER CIRCUIT

This application is a U.S. National Stage of International Application No. PCT/AU2015/000298, filed May 20, 2015, which claims benefit of Australia Application No. 2014901924, filed on May 22, 2014, which are incorporated by reference herein.

TECHNICAL FIELD

The present invention relates to a symmetry control circuit of a trailing edge phase control dimmer circuit for controlling alternating current (AC) power to a load, and a method of controlling symmetry of non-conduction periods of each half cycle of the alternating current (AC) power for the trailing edge phase control dimmer circuit.

In particular, but not exclusively, the present invention relates to a symmetry control circuit for a 2-wire trailing edge phase control dimmer circuit for controlling a capacitive load, such as a driver for LED lights.

BACKGROUND OF INVENTION

Dimmer circuits are commonly used to control power, in particular alternating current (AC) mains power, to a load, such as a light source. In one existing method, a light source can be dimmed using phase controlled dimming whereby power provided to the load is controlled by varying the amount of time that a switch connecting the load to a mains power source is conducting during a cycle of the AC (i.e. varying the duty time). Specifically, AC power to the load is switched ON and OFF during each half cycle of alternating current and the amount of dimming of the load is provided by the amount of ON time in relation to the OFF time for each half cycle.

Phase control dimmer circuits generally operate as trailing edge or leading edge dimmer circuits, and the two circuits are suited to different applications. In leading edge circuits, power is switched OFF at the beginning of each half cycle. In trailing edge circuits, power is switched OFF later in each half cycle (e.g. towards the end of each half cycle). Leading edge dimmer circuits are generally better suited to controlling power to inductive loads, such as small fan motors and iron core low voltage lighting transformers. Trailing edge dimmer circuits, on the other hand, are generally better suited to controlling power to capacitive loads, such as drivers for Light Emitting Diode (LED) lights.

Phase control dimmer circuits, however, can produce line conducted harmonics causing electromagnetic interference (EMI) emissions when switching ON and OFF power to the load—particularly, for instance, switching ON and OFF power to complex loads such as compact fluorescent lighting (CFL) and LED light drivers. More specifically, these dimmer circuits include a switching circuit for controlling delivery of AC power to the load by conducting power to the load in an ON state (conduction period) and not conducting power to the load in an OFF state (non-conduction period). During the OFF state of each half cycle of AC, power is available to the dimmer circuit for operation thereof. This AC (line) power provided to the dimmer circuit in the non-conduction period is first rectified by a rectifier. The rectified dimmer voltage (e.g. rectified via full-wave rectifier) is of a pulse form, normally—under symmetrical non-conduction period operating conditions of the dimmer circuit—having repetition rate equal to twice the line frequency. If asymmetrical conditions exist in the non-conduction periods, then repetition rate becomes line frequency (or lower is possible), which manifests itself as lamp flicker in if the load type is a LED light driver or a CFL driver.

Generally, the input stage of the load (e.g. electronic load such as CFL or LED driver) includes some EMI filtering capacitance on the AC side of a diode bridge rectifier, in addition to a small (or large) bulk capacitance on the DC side. The input stage of the load comprising the EMI filter, bridge rectifier and a bulk reservoir capacitor is, however, largely responsible for producing asymmetrical operating conditions in the non-conduction periods of typical exemplary existing 2-wire trailing edge phase control dimmer circuits which run constant conduction periods. Indeed, when such a load is controlled by the exemplary dimmer circuits running with constant conduction periods at the detection of the dimmer voltage zero-crossing, this load type circuit topology is inherently prone to producing asymmetrical power draw at each half-cycle polarity of the AC due to phase-shift effects on the dimmer voltage zero-crossing caused by at least in part the ripple voltage components. Hence, the asymmetrical power draw at each half-cycle polarity of the AC can result in the undesirable effect of flickering of an LED light driven by the load.

More specifically, with respect to an exemplary 2-wire trailing edge phase control dimmer circuit of the prior art, the instantaneous voltage appearing across the dimmer circuit during the non-conduction part of each AC half-cycle is equal to the instantaneous line voltage subtract the rectified load voltage including any ripple voltage appearing on DC side of the diode bridge rectifier (disregarding the comparatively low diode forward voltages of the diode bridge). The remaining line voltage component applied to the dimmer circuit is thus always lower than the full line voltage and consequently has phase advancement of the zero-crossing by an amount in proportion to the instantaneous magnitude of rectified load voltage appearing on the DC side of the diode bridge rectifier. The dimmer circuit commences each half-cycle conduction period immediately upon detection of the zero-crossing, which now has an amount of phase advancement determined by the instantaneous rectified load voltage and the ripple voltage. Thus, increased phase advancement in one half-cycle polarity results in reduced magnitude of corresponding rectified load voltage. This increase in phase advancement then results in reduced phase advancement for the successive half-cycle conduction period, which further results in increased magnitude of corresponding rectified load voltage, which again produces increased phase advancement of the successive half-cycle conduction period. Accordingly, in this exemplary prior art dimmer circuit, AC power can be continually applied asymmetrically to the load during symmetric conductions periods, which can cause the abovementioned problems such as flicker in lighting loads.

SUMMARY OF INVENTION

Accordingly, in one aspect, the present invention provides a symmetry control circuit for a trailing edge phase control dimmer circuit for controlling alternating current (AC) power to a load, the symmetry control circuit including: a bias signal generator circuit configured to monitor non-conduction periods of each half cycle of said AC power for an elapsed duration of the non-conduction periods, and generate a bias signal voltage based on the elapsed duration, whereby an amplitude of the bias signal voltage is proportional to the elapsed duration of the non-conduction periods;

and a bias signal converter circuit configured to convert the bias signal voltage to a bias signal current, wherein the bias signal current is added to a reference current of a conduction period timing circuit configured to determine said conduction periods, and wherein the conduction period timing circuit is configured to alter one of the conduction periods immediately following one of the non-conduction periods based on the bias signal current when added to the reference current to compensate for a phase shift of a zero-crossing of said one of the non-conduction periods corresponding to an elapsed duration of said one of the non-conduction periods so as to restore symmetry of the non-conduction periods of each half cycle of AC power.

In another aspect, the present invention provides a method of controlling symmetry of non-conduction periods of each half cycle of alternating current (AC) power for a trailing edge phase control dimmer circuit for controlling said AC power to a load, the method including: monitoring non-conduction periods of each half cycle of said AC power for an elapsed duration of the non-conduction periods; generating a bias signal voltage based on the elapsed duration, whereby an amplitude of the bias signal voltage is proportional the elapsed duration of the non-conduction periods; converting the bias signal voltage to a bias signal current; adding the bias signal current to a reference current of a conduction period timing circuit configured to determine said conduction periods; and altering one of the conduction periods immediately following one of the non-conduction periods based on the bias signal current when added to the reference current to compensate for a phase shift of a zero-crossing of said one of the non-conduction periods corresponding to an elapsed duration of said one of the non-conduction periods so as to restore symmetry of the non-conduction periods of each half cycle of AC power.

It will be appreciated by those persons skilled in the art that a rectifier of a dimmer circuit, such as the above mentioned trailing edge phase control dimmer circuit for controlling alternating current (AC) power to a load, rectifies line voltage of the AC power to provide rectified voltage to the dimmer circuit during the non-conduction periods of each half cycle of the AC power. Also, the load incorporates a rectifier (e.g. a full-wave rectifier) and, in particular, a smoothing capacitor—producing a ripple voltage within the load. The ripple voltage in the load is ultimately the cause of phase-shift effects on the zero-crossing of the dimmer rectified voltage. Specifically, the instantaneous voltage appearing at the rectifier during the non-conduction periods is equal to the line voltage minus the rectified load voltage. The instantaneous voltage appearing at the dimmer rectifier is therefore lower than the line voltage, resulting in an earlier zero-crossing succeeding the non-conduction period; hence, a phase shift of the zero-crossing of the non-conduction period.

In an embodiment, the bias signal generator circuit includes a non-conduction period integrator circuit configured to generate a non-conduction period integrator signal indicative of the elapsed non-conduction period. Thus, in use, the symmetry control circuit provides the bias signal current to the conduction period timing circuit so that the conduction period timing circuit can dynamically alter a conduction period immediately following one of the non-conduction periods so as to correct for detected asymmetry in the non-conduction period demonstrated by the phase shift of the zero crossing of the non-conduction period. The phase shift determined by the bias signal generator circuit is therefore based on the instantaneous rectified voltage within the load. Thus, the symmetry control circuit monitors each elapsed half-cycle non-conduction period and proportionally modifies the amplitude of the generated bias voltage signal to compensate for the instantaneous rectified voltage within the load. That is, the embodiment, first acts to monitor change in duration of a non-conduction period, then uses the magnitude outcome of the change in duration to influence the successive conduction period in the necessary direction to counter-act the change in duration of that non-conduction period.

Detected changes in the non-conduction period result in opposing changes in the next conduction period to restore symmetry in the successive non-conduction periods. For example, an increase in a first half-cycle non-conduction period will cause a decrease in the subsequent half-cycle conduction period, which will in turn increase the following associated non-conduction period to restore symmetry. The restoration of symmetry enables a wider range of electronic load types, such as capacitive loads, to be dimmed with flicker-free operation. Indeed, this symmetry correction mechanism can permit flicker-free operation with, for instance, typically non-dimmable electronic loads, especially when operated in a high conduction angle region.

In an embodiment, the non-conduction period integrator circuit includes a resistor R1 in series with a capacitor C1. For example, the resistor R1 is a 1 MΩ resistor and the capacitor C1 is a 10 nF capacitor.

In an embodiment, the bias signal generator circuit further includes a quasi-peak detector circuit including a transistor Q1 in series with an RC circuit to generate a peak detector current signal using the non-conduction period integrator signal. For example, the RC is a resistor R2 in parallel with a capacitor C2, where the resistor R2 is a 1 MΩ resistor and the capacitor C2 is a 10 nF capacitor.

In an embodiment, the bias signal generator circuit further includes a capacitor C3 in series with the transistor Q1 to perform integration of the peak detector current signal to generate the bias signal voltage.

In an embodiment, the bias signal converter circuit includes a transistor Q2 in series with a resistor R3 to convert the bias signal voltage to the bias signal current. In another embodiment, the bias signal converter circuit includes an op-amp of some other active device to convert the bias signal voltage to the bias signal current. In any case, the bias voltage signal is converted to a corresponding current, which is then added to the reference current associated with the conduction period timing. It will be appreciated by those persons skilled in the art that the half-cycle conduction period is inversely proportional to the reference current, and the addition of the bias signal current decreases the corresponding conduction period.

In an embodiment, the capacitor C3 is initialised at each of the conduction periods by transistors Q10 and Q9 of the conduction period timing circuit at a zero-crossing exit of the AC for each corresponding half cycle. It will be appreciated by those persons skilled in the art that the AC has a zero-crossing entry and an exit.

BRIEF DESCRIPTION OF DRAWINGS

Embodiments of the invention will now be described, by way of example only, with reference to the accompanying drawings, in which.

DETAILED DESCRIPTION

Figure 1:
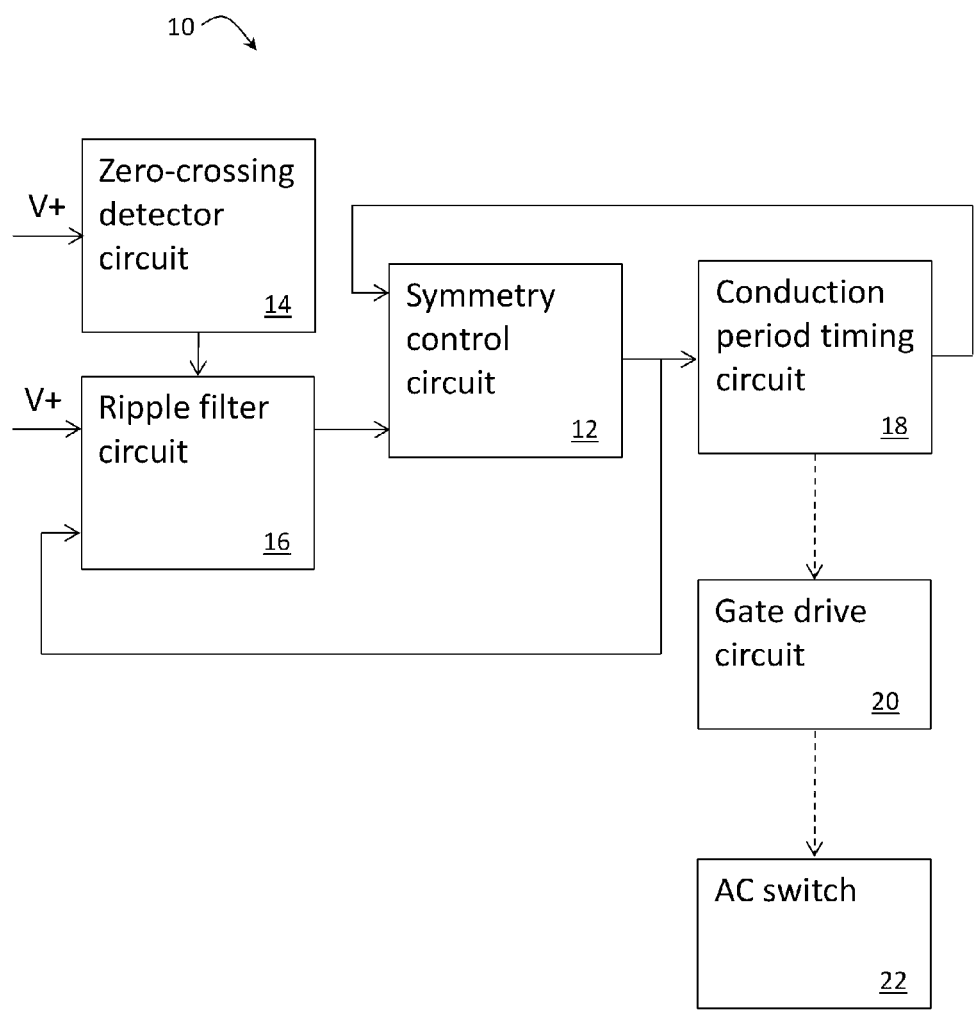
FIG. 1 is a block diagram showing some circuits of a trailing edge phase control dimmer circuit dimmer circuit, including a symmetry control circuit according to an embodiment of the present invention.

FIG. 1 shows some of the circuits of a 2-wire trailing edge dimmer circuit 10 according to an embodiment of the present invention that are configured to control power to a load. More specifically, FIG. 1 shows those circuits that are configured to operate in association with a symmetry control circuit 12. It will be appreciated by those persons skilled in the art that many of the circuits of the dimmer circuit 10 do not affect operation of the symmetry control circuit 12 and thus will not be discussed in detail herein.

The dimmer circuit 10 shown in FIG. 1 includes an AC switching circuit 22 connected to a gate drive circuit 20 for controlling switching ON and OFF of the switching circuit 22 to control AC power to the load. The above mentioned conduction period occurs when AC power is switched ON so as to be conducted to the load and the non-conduction period is when the AC power is switched OFF so as to not be conducted to the load. The switching circuit 22, for instance, includes two MOSFET switching devices (e.g. high voltage (600V) N-channel MOSFETs such as a FCPF11N60), which are used to control the amount of AC power delivered to the load. The MOSFETs are configured so that they alternately control power delivery to the load over the different polarity half cycles of AC power. That is, the MOSFETs turn-ON and turn-OFF the AC switching circuit 22 at each cycle of the AC, respectively, so that the load (e.g. a driver for LED down lights) is dimmed in proportion to the amount of time in each cycle that the switching circuit 12 is switched OFF and not conducting power to the load. In an embodiment, the load is, for instance, a capacitive load in the form of a driver for LED lights or CFLs.

The symmetry control circuit 12 is connected to a conduction period timing circuit 18—for example, a current based conduction period timing circuit—configured to perform the function of altering the conduction period to restore symmetry of the non-conduction periods as discussed above based on the outputted bias signal current of the symmetry control circuit 12. The conduction period timing circuit 18 is connected to the gate drive circuit 20 so as to drive the MOSFETs to turn-ON and turn-OFF the AC switching circuit 12 to provide the conduction and the non-conduction periods.

The symmetry control circuit 12 also receives input from a ripple filter circuit 16 configured to filter the aforementioned ripple voltage and, in turn, a zero-crossing detector circuit 14 configured to detect a zero crossing of the AC line conduction periods and non-conduction periods. The symmetry control circuit 12 also influences discharge time of the ripple filter circuit 16 in such a manner so as to counter-act tendency of the ripple filter circuit 16 to produce an asymmetrical conduction period when the dimmer circuit 10 is controlling certain types of loads, such as capacitive loads.

The ripple filter circuit 16 is also configured to provide a time averaged zero-crossing signal for the symmetry control circuit 12.

The ripple filter circuit 16 provides attenuation of the amplitude of line ripple signals, which, for instance, are periodically super-imposed on the line voltage for network infrastructure control purposes, to provide a more accurate, time-averaged zero-crossing signal which reduces consequent modulation of conduction periods. As discussed, the modulation (asymmetry) of conduction periods can cause associated variations in lamp brightness level where the load is a lamp driver. The ripple filter circuit 16 of the dimmer circuit 10 can be implemented in a number of configurations to produce the time-averaged zero-crossing signal. For example, the ripple filter circuit 16 can employ two zero-cross detectors (e.g. filtered and unfiltered zero-cross detectors) to filter the ripple signals. Another possible configuration comprises a single filtered zero-cross detector. In the dual zero-cross detection scheme, however, the unfiltered zero-cross detector can provide significantly more precise detection of ripple signals.

Figure 2:
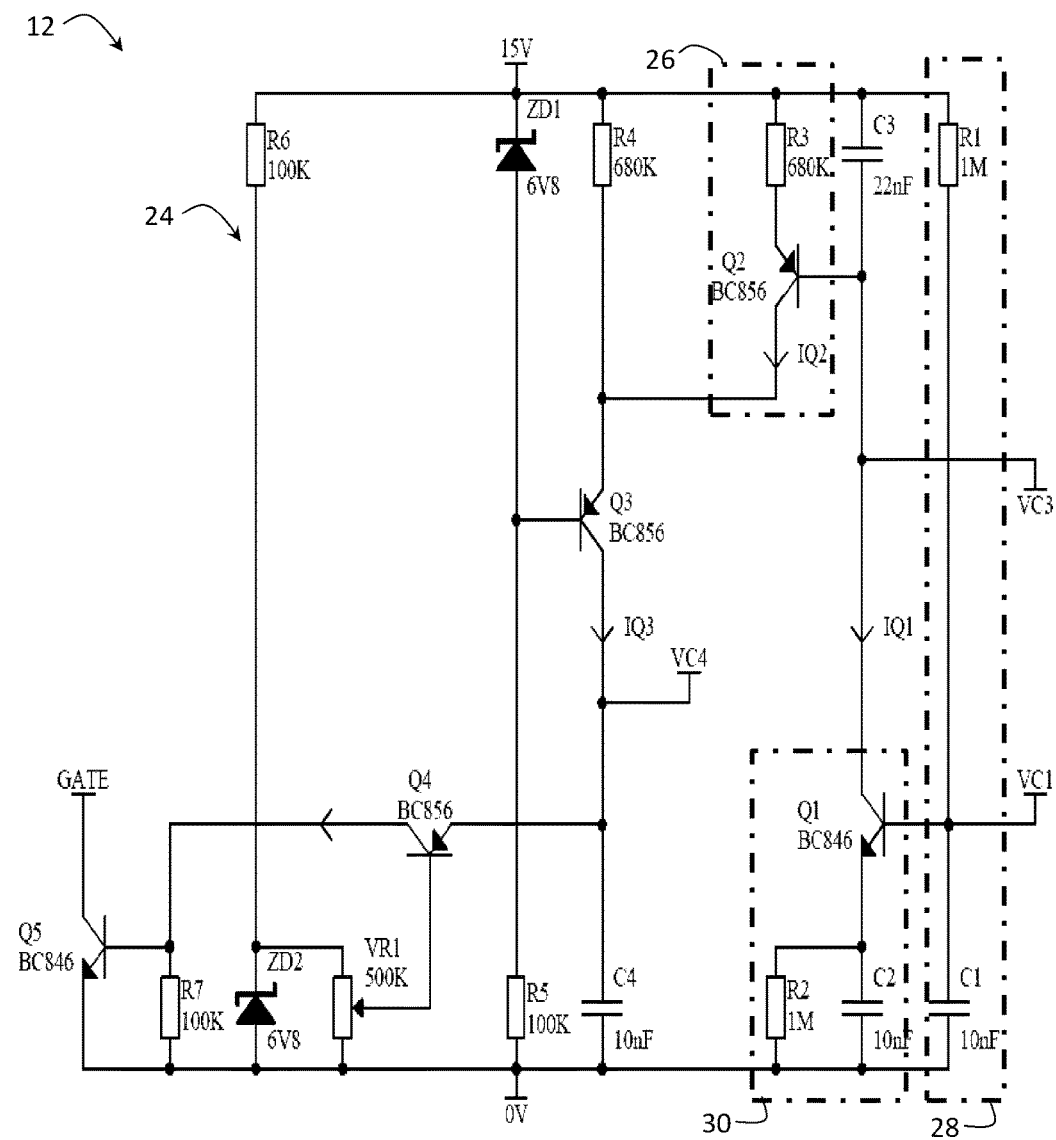
FIG. 2 shows a symmetry control circuit for a trailing edge phase control dimmer circuit according to an embodiment of the present invention.

FIG. 2 shows an embodiment of the symmetry control circuit 12 for the trailing edge phase control dimmer circuit 10 for controlling alternating current (AC) power to a load. The symmetry control circuit 12 includes a bias signal generator circuit 24 configured to monitor non-conduction periods of each half cycle of said AC power for an elapsed duration of the non-conduction periods, and generate a bias signal voltage based on the elapsed duration of the non-conduction periods, whereby an amplitude of the bias signal voltage is proportional to the elapsed duration of the non-conduction periods.

The symmetry control circuit 12 also includes a bias signal converter circuit 26 configured to convert the bias signal voltage to a bias signal current. The bias signal current is then added to a reference current of the conduction period timing circuit 18 which is configured to determine the duration of the conduction periods. It will be appreciated by those persons skilled in the art that the conduction periods, without being altered, are determined using the zero-crossing detector circuit 14. The conduction period timing circuit 18 is configured to alter a duration of a conduction period immediately following one of the non-conduction periods based on the bias signal current when added to the reference current to compensate for a phase shift of a zero-crossing of this non-conduction period corresponding to an elapsed duration of this non-conduction period so as to restore symmetry of the successive non-conduction periods of each half cycle of AC power.

More specifically, the bias signal generator circuit 24 includes a non-conduction period integrator circuit 28 configured to generate a non-conduction period integrator signal indicative of a rectified dimmer voltage generated by a rectifier of the dimmer circuit during the non-conduction period. In the embodiment, the non-conduction period integrator circuit 28 includes a resistor R1 in series with a capacitor C1, where the resistor R1 is a 1 MΩ resistor and the capacitor C1 is a 10 nF capacitor. In another embodiment R1 is replaced with a constant current source for potentially more accurate integration.

The bias signal generator circuit 24 further includes a quasi-peak detector circuit 30 including a transistor Q1 in series with an RC circuit to generate a peak detector current signal using the non-conduction period integrator signal. That is, the quasi-peak detector function is performed by the voltage follower transistor Q1 in conjunction with a resistor R2 in parallel with a capacitor C2 to produce the signals VC2 and IQ1 shown in FIGS. 4 and 5. In the embodiment, the resistor R2 is a 1 mΩ resistor and the capacitor C2 is a 10 nF capacitor.

Further, the bias signal generator circuit 24 further includes a capacitor C3 in series with the transistor Q1 to perform integration of the peak detector current signal IQ1 to generate the bias signal voltage. The bias signal converter circuit 26 converts the bias signal voltage across the capacitor C3 with transistor Q2 in series with resistor R3 to form the bias signal current IQ2 shown in FIGS. 4 and 5. In the embodiment, the resistor R3 is a 680KΩ resistor and the capacitor C3 is a 22 nF capacitor. Also, transistors Q1 and Q2 are BC856 PNP transistors.

Figure 3:
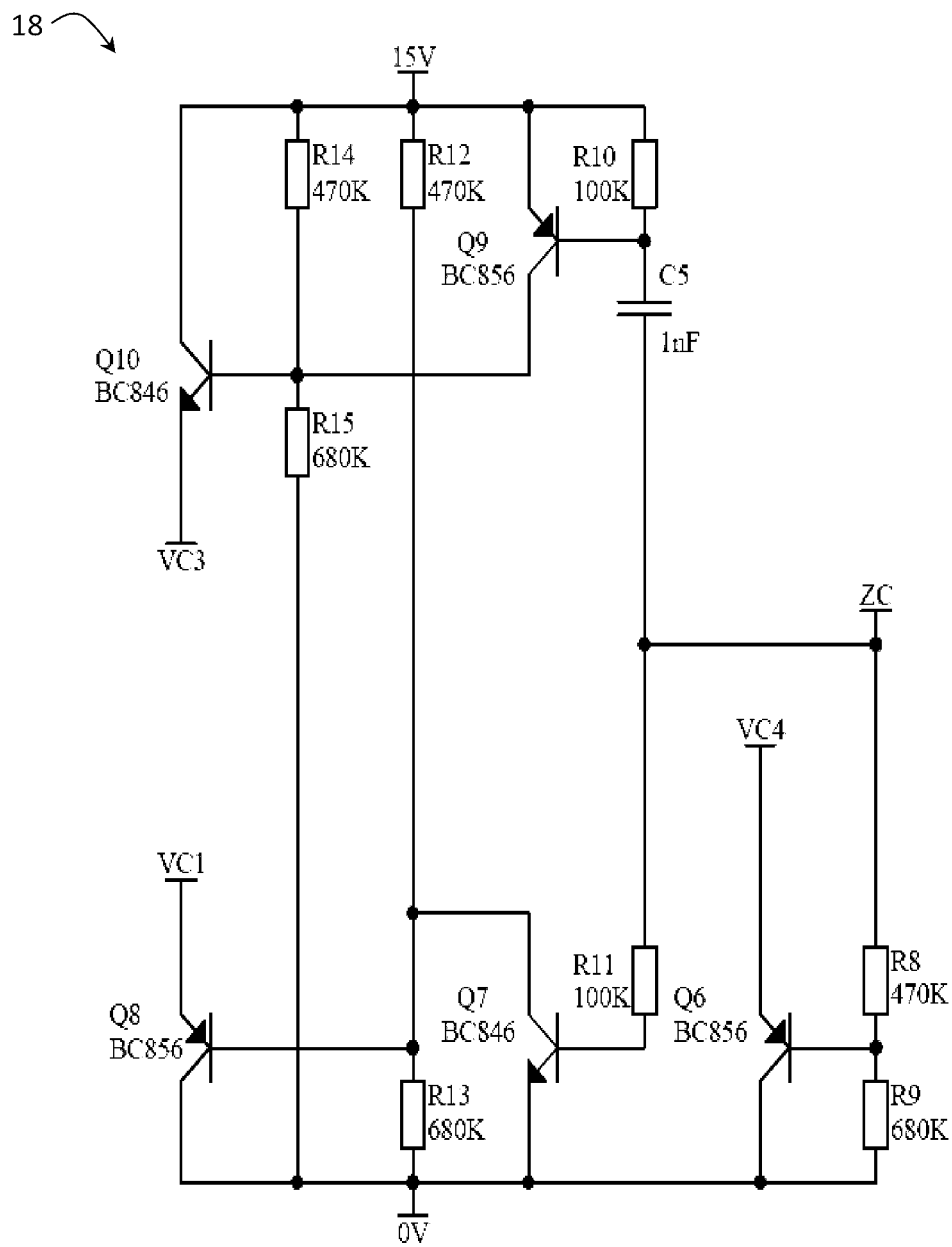
FIG. 3 shows a conduction period timing circuit used in connection with the symmetry control circuit of FIG. 2.

With reference to FIG. 3, the capacitor C3 is initialised, or reset, at end of each of the conduction periods by transistors Q10 and Q9 of the conduction period timing circuit 18 at the zero-crossing exit of the AC for each corresponding half cycle. Also, initialisation, or reset, of the off-period (non-conduction period) integrator capacitor C1 during each half-cycle conduction period is achieved by transistors Q8 & Q7 of the conduction period timing circuit 18, and associated bias resistors, according to a state outputted from the zero-crossing detector circuit 14.

Figure 5:
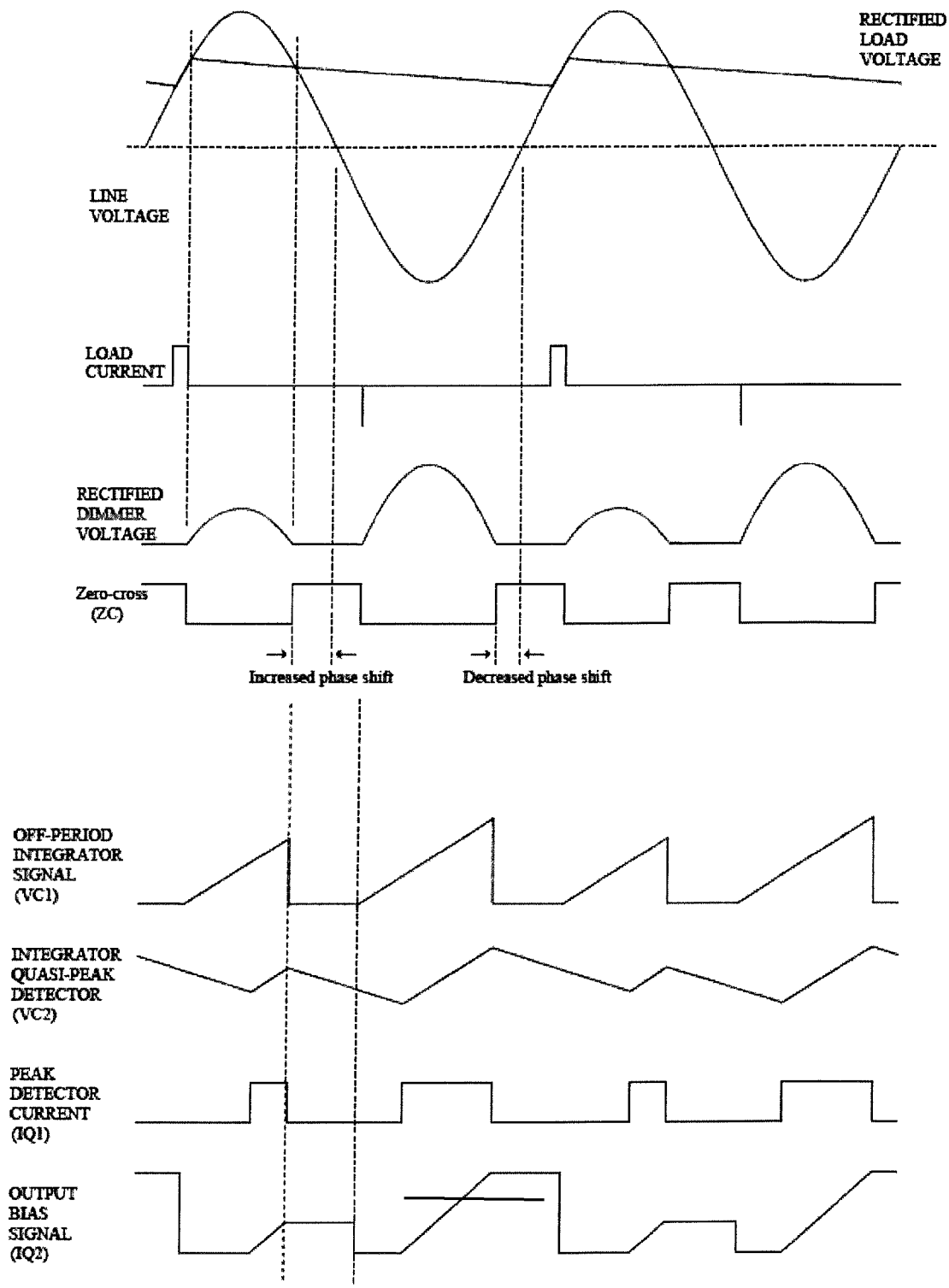
FIG. 5 shows further voltage and current waveforms for a trailing edge phase control dimmer circuit having a symmetry control circuit according to an embodiment of the present invention.

With reference to FIG. 5, it can be seen that even though each half-cycle polarity the trailing edge dimmer circuit applies constant conduction period to the load, it is the asymmetrical phase advancement of the dimmer voltage zero-crossing produced by the load which reinforces the condition of asymmetrical application of power to the load; hence, sustained flickering outcome described above. This condition of asymmetrical application of power to the load is observed as asymmetry in half-cycle dimmer voltage zero-crossing phase advancement, and in the asymmetry in non-conduction periods and/or in the half-cycle load voltage and current.

The initialisation of integrator capacitor C3 at end of each half-cycle conduction period is achieved by transistors Q10 & Q9 of the conduction period timing circuit 18 and associated bias resistors, at the falling-edge of the output of zero-crossing detector circuit 14. In the current-based half-cycle conduction period timing circuit 18, transistor Q3 and resistor R4 convert a reference voltage established by resistor R5 and Zener diode ZD1 into the corresponding reference current to charge a timing capacitor C4. Half-cycle reset of C4 is achieved by transistor Q6 and associated bias resistors, as necessary according to a state of the zero-crossing detector circuit 14.

Transistor Q4 performs a basic comparator function to produce a gate drive cut-off signal to be sent to a gate drive circuit 20 of the AC switching circuit 22 of the dimmer circuit 10 when the half-cycle voltage across the timing capacitor C4 exceeds the control voltage level determined by potentiometer VR1 in addition to Q4 emitter-base forward bias voltage. The transistor Q5 output connects to the gate drive circuit 20 in order to turn off the MOSFETs at the end of each half-cycle conduction period.

Figure 4:
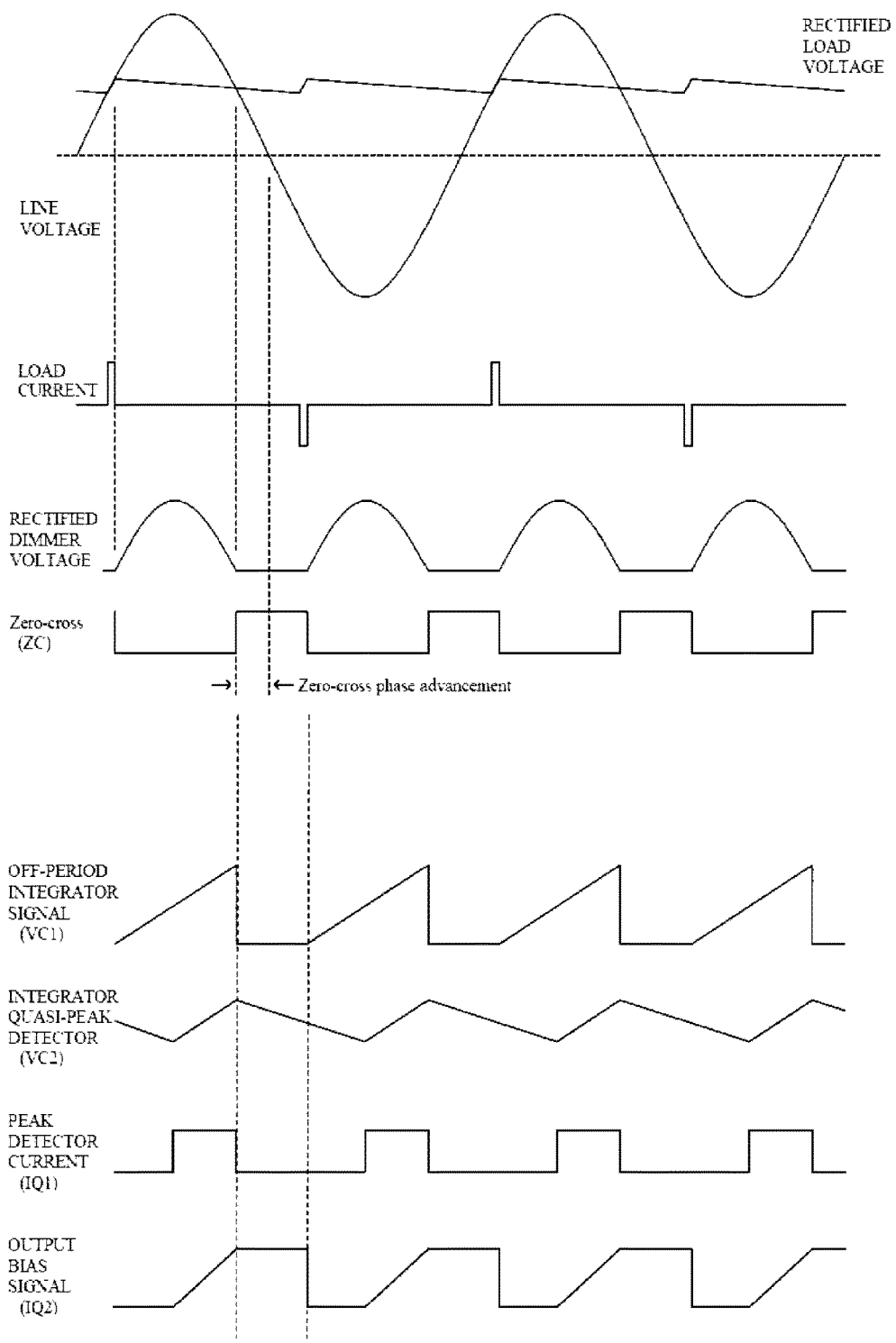
FIG. 4 shows voltage and current waveforms for a trailing edge phase control dimmer circuit having a symmetry control circuit according to an embodiment of the present invention.

FIG. 5 and FIG. 4 thus depict various voltage and current waveforms, relative to line voltage, which are associated with operation of a 2-wire trailing edge dimmer circuit 10. FIG. 4 shows an example of operation of the dimmer circuit with the symmetry control circuit 12 and a load for, say, a typical low power-factor load type, e.g. a driver for LED lights, when half-cycle operation is symmetrical. Here, rectified load voltage is dc voltage appearing across an internal reservoir capacitor having twice AC-line frequency ripple voltage components. Load current includes a current pulse in each polarity half-cycle when the instantaneous line voltage exceeds the prevailing rectified load voltage. Half-cycle rectified dimmer voltage is the difference between line voltage and rectified load voltage, and the rectified dimmer voltage zero-crossing is consequently phase-advanced in comparison to the line voltage zero-crossing.

The half-cycle off-period (non-conduction period) integrator signal VC1 produces a linear voltage ramp with peak amplitude proportional to the time that the dimmer voltage appears. The half-cycle quasi-peak detector voltage signal VC2 comprises a dc component and superimposed twice-line frequency ripple component. The half-cycle capacitor charging current pulses associated with the quasi-peak detector have essentially a constant amplitude and pulse-width, which is determined by slope of off-period integrator and ripple voltage amplitude of quasi-peak detector capacitor respectively. Here, the half-cycle amplitude of the output bias signal current IQ2 is proportional to pulse-width of current pulses associated with the quasi-peak detector circuit.

FIG. 5 depicts voltage and current waveforms, relative to line voltage, associated with the embodiment of the dimmer circuit 10 and a load for a typical low power-factor load type when half-cycle operation is asymmetrical. The rectified load voltage ripple voltage includes an AC-line frequency ripple signal component, which could cause a light to flicker if the load is a light driver such as an LED light driver.

The load current pulses shown in FIG. 5 exhibit half-waving characteristics, where pulses are widened in one polarity and narrower or even absent in the opposite polarity. The half-cycle rectified dimmer voltage also displays asymmetry. The amount of phase-advancement of the rectified dimmer voltage zero-crossing increases for one polarity and decreases for opposite polarity. Consequently, the peak amplitude of half-cycle off-period integrator signal VC1 increases for the half-cycle polarity exhibiting reduced phase-shift, and decreases for the half-cycle polarity exhibiting increased phase-shift. The ripple voltage amplitude of half-cycle quasi-peak detector voltage signal now varies in accordance with peak amplitude of half-cycle off-period integrator signal. The alternating pulse widths of half-cycle charging current pulses associated with quasi-peak detector current signal IQ2 reflect the alternating ripple voltage amplitude of half-cycle quasi-peak detector voltage signal VC2. The alternating amplitudes of half-cycle output bias current signal IQ2 reflect the alternating pulse widths of half-cycle charging current pulses associated with quasi-peak detector current IQ1. The half-cycle output bias current signal Q2 is added to the reference current of the current-based half-cycle conduction period timing circuit 12 to restore symmetry of the non-conduction periods during operation of the dimmer circuit 10.

It will be understood that there may be other variations and modifications to the configurations describe here that are also within the scope of the present invention.

The invention claimed is:

1. A symmetry control circuit for a trailing edge phase control dimmer circuit for controlling alternating current (AC) power to a load, the symmetry control circuit including:
    a bias signal generator circuit configured to monitor non-conduction periods of each half cycle of said AC power for an elapsed duration of the non-conduction periods, and generate a bias signal voltage based on the elapsed duration, whereby an amplitude of the bias signal voltage is proportional to the elapsed duration of the non-conduction periods; and a bias signal converter circuit configured to convert the bias signal voltage to a bias signal current, wherein the bias signal current is added to a reference current of a conduction period timing circuit configured to determine said conduction periods, and wherein the conduction period timing circuit is configured to alter one of the conduction periods immediately following one of the non-conduction periods based on the bias signal current when added to the reference current to compensate for a phase shift of a zero-crossing of said one of the non-conduction periods corresponding to an elapsed duration of said one of the non-conduction periods so as to restore symmetry of the non-conduction periods of each half cycle of AC power.

2. A symmetry control circuit as claimed in claim 1, wherein the bias signal generator circuit includes a non-conduction period integrator circuit configured to generate a non-conduction period integrator signal indicative of the elapsed duration of the non-conduction periods.

3. A symmetry control circuit as claimed in claim 2, wherein the non-conduction period integrator circuit includes a resistor R1 in series with a capacitor C1.

4. A symmetry control circuit as claimed in claim 2, wherein the bias signal generator circuit further includes a quasi-peak detector circuit including a transistor Q1 in series with an RC circuit to generate a peak detector current signal using the non-conduction period integrator signal.

5. A symmetry control circuit as claimed in claim 4, wherein the bias signal generator circuit further includes a capacitor C3 in series with the transistor Q1 to perform integration of the peak detector current signal to generate the bias signal voltage.

6. A symmetry control circuit as claimed in claim 5, wherein the bias signal converter circuit includes a transistor Q2 in series with a resistor R3 to convert the bias signal voltage to the bias signal current.

7. A symmetry control circuit as claimed in claim 5, wherein the capacitor C3 is initialised at an end of each of the conduction periods by transistors Q10 and Q9 of the conduction period timing circuit at a zero-crossing exit of the AC for each corresponding half cycle.

8. A method of controlling symmetry of non-conduction periods of each half cycle of alternating current (AC) power for a trailing edge phase control dimmer circuit for controlling said AC power to a load, the method including:

monitoring non-conduction periods of each half cycle of said AC power for an elapsed duration of the non-conduction periods;

generating a bias signal voltage based on the elapsed duration, whereby an amplitude of the bias signal voltage is proportional the elapsed duration of the non-conduction periods;

converting the bias signal voltage to a bias signal current;

adding the bias signal current to a reference current of a conduction period timing circuit configured to determine said conduction periods; and altering one of the conduction periods immediately following one of the non-conduction periods based on the bias signal current when added to the reference current to compensate for a phase shift of a zero-crossing of said one of the non-conduction periods corresponding to an elapsed duration of said one of the non-conduction periods so as to restore symmetry of the non-conduction periods of each half cycle of AC power.

9. A method as claimed in claim 8, further including generating a non-conduction period integrator signal indicative of the elapsed duration of the non-conduction periods.

10. A method as claimed in claim 9, further including generating a peak detector current signal using the non-conduction period integrator signal.

11. A method as claimed in claim 10, further including integrating the peak detector current signal with a capacitor C3 in series with the transistor Q1 to generate the bias signal voltage.

12. A method as claimed in claim 11, further including converting the bias signal voltage to the bias signal current.

13. A method as claimed in claim 11, further including initialising the capacitor C3 at an end of each of the conduction periods at a zero-crossing exit of the AC for each corresponding half cycle.

* * * * *